United States Patent [19]

van der Floe et al.

[11] 3,736,529

[45] May 29, 1973

[54] ELECTRICAL CIRCUIT FOR GENERATING PRECISE HIGH FREQUENCY OSCILLATION INTERMITTENTLY MODULATABLE IN FREQUENCY

[75] Inventors: Hans O. van der Floe, Selzach; Johann Christian Friedli, Langendorf, both of Switzerland

[73] Assignee: Autophon Aktiengesellschaft, Solothurn (Canton of Soleure), Switzerland

[22] Filed: July 9, 1971

[21] Appl. No.: 161,210

[30] Foreign Application Priority Data

July 10, 1970 Switzerland ........................10456/70

[52] U.S. Cl. ........................................332/18, 331/23

[51] Int. Cl. ................................................H03c 3/08

[58] Field of Search ........................332/16, 16 T, 18, 332/30 V; 331/14, 18, 23, 25

[56] References Cited

UNITED STATES PATENTS

| | | | |
|---|---|---|---|
| 2,541,454 | 2/1951 | White et al. | 331/14 X |
| 3,035,234 | 5/1952 | Hillman | 331/18 X |
| 3,312,903 | 4/1967 | Webb | 331/18 X |
| 3,414,842 | 12/1968 | Broadhead | 331/18 X |

*Primary Examiner*—Alfred L. Brody
*Attorney*—George F. Dvorak, Stephen T. Skrydlak and Marden S. Gordon

[57] ABSTRACT

An electrical circuit arrangement for generating a high frequency oscillation of high frequency precision intermittently modulatable in its frequency so that a frequency modulated signal can be periodically delivered. A high frequency semi-conductor oscillator receives two voltage inputs for controlling the output of the same, one of the inputs being of a predetermined modulated value, with the other input being a function of a correction signal derived by comparing the output of the oscillator with a predetermined unmodulated signal for maintaining the output at the desired frequency.

2 Claims, 1 Drawing Figure

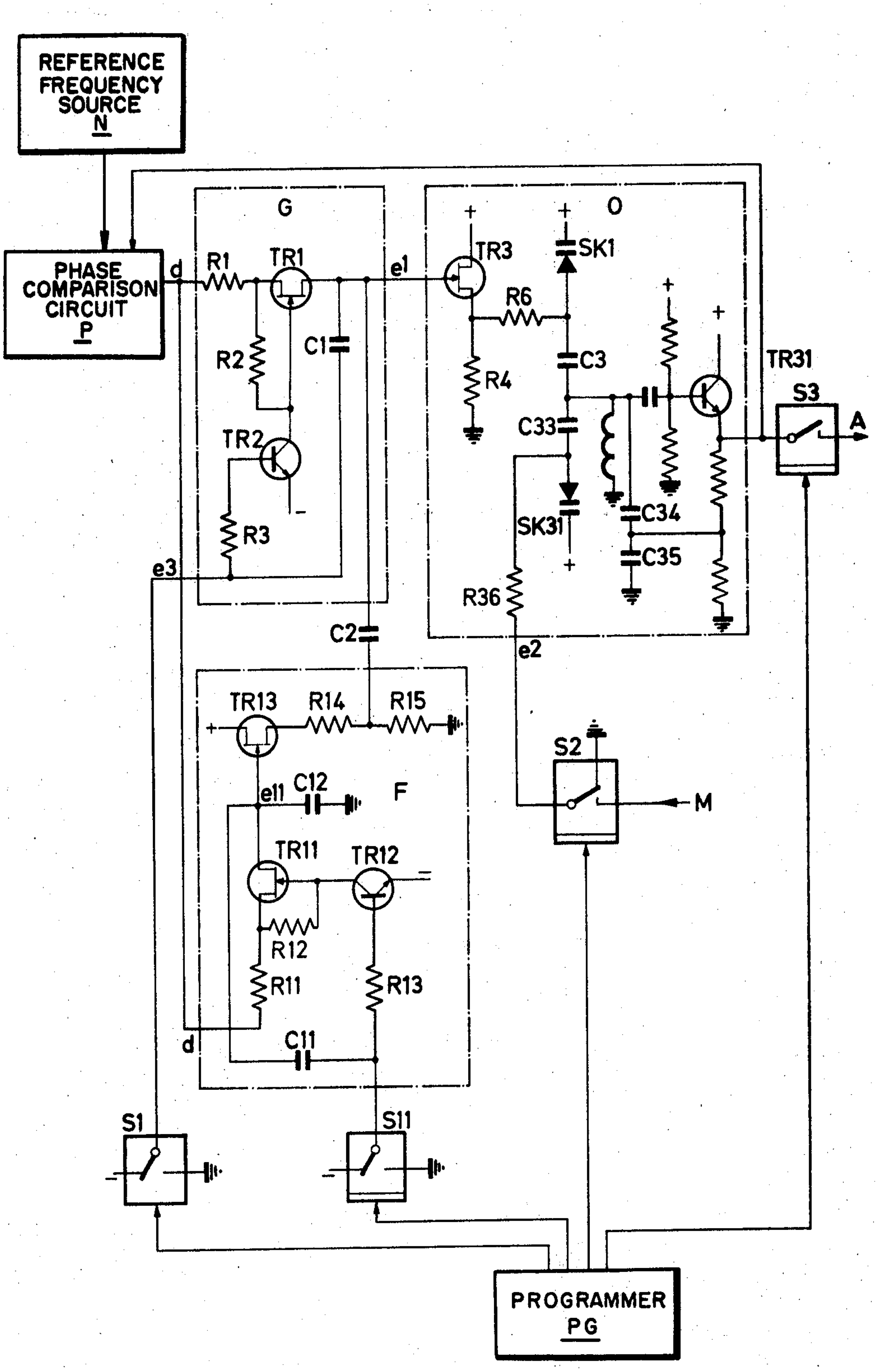
REFERENCE FREQUENCY SOURCE N
PHASE COMPARISON CIRCUIT P
d
R1
TR1
G
R2
C1
TR2
R3
e3
e1
TR3
O
SK1
R6
R4
C3
C33
SK31
C34
C35
R36
e2
TR31
S3
A
C2
TR13
R14
R15
e11
C12
F
TR11
TR12
R12
R11
R13
d
C11
S2
M
S1
S11
PROGRAMMER PG

ELECTRICAL CIRCUIT FOR GENERATING PRECISE HIGH FREQUENCY OSCILLATION INTERMITTENTLY MODULATABLE IN FREQUENCY

BACKGROUND OF THE INVENTION

On numerous occasions it is desired to make use of a frequency modulated signal which has to be delivered only periodically. Thus, there is a first stage of operation wherein the oscillator would function normally, and a second phase of operation wherein the oscillator would be called upon to deliver a modulated signal. However, when semi-conductor devices are used a serious problem is encountered in that the switch-over process between the first phase and the second phase causes a troublesome effect due to the capacitance effect of transistors, the greatest problem encountered with field-effect transistors. During this switching, the oscillator is cut-off from the control of the correction signal (i.e. the signal generated as a difference between the output of the generator and a preselected control signal), this cut-off causing a voltage jump to be transmitted to the oscillator over the capacitance present due to the transistors. Thus, while the frequency of the generated oscillation was correct before the cut-off, it is changed undesirably by the cutting off of the correction signal voltage due to this capacitance effect.

This troublesome problem of capacitance at the time of switching can be reduced by compensating for the same by supplying to the regulating input of the oscillation generator an oppositely directed voltage derived from the switching pulse, such voltage being supplied over a capacitance corresponding to the capacitance of the transistor to the input of the oscillator. While such a compensation can provide a considerable improvement, it is not sufficient of itself in cases in which a very high precision is required because of the dependence of the transistor capacitance on the voltages applied.

Other possibilities for reducing the harmful influences of the switching capacitance include the increasing of the capacitance of the storage capacitor along with a reduction of the steepness of regulation. However, against the use of an unrestricted increase of the capacitance by which the ratio of the capacitance of the storage capacitor and the capacitance between the control of the switching transistor is altered there stands the consideration of the lengthening of regulating time associated with such capacitance. As to a reducing of the regulating steepness there are the obstacles encountered relative to the pull-in range required to pull the operator back within the desired regulated frequency range.

SUMMARY OF THE INVENTION

The present invention overcomes the difficulties previously encountered and now makes it possible to achieve agreement between the frequency to be regulated and the normal control frequency, with switching of the signal so that the same may be delivered only periodically and still be maintained within the desired range of modulation. It includes in addition to the high frequency oscillator and normal switching arrangement for controlling the same an electronic semi-conductor switch arrangement interposed between the control input of the oscillator and the normal type of feedback comparison circuit, the influence of the correction signal voltage on the frequency of the oscillator over the semi-conductor switch being smaller than the direct influence of the correction signal voltage over the previous type switch arrangements so that a smaller effect is realized due to transistor capacitance at times of switching.

A further feature of the present circuit arrangements is that between the first phase of operation where no signal is put out, and the second phase of operation wherein the switching is complete and a signal is being put out, there is interposed an intermediate phase permitting the recovery of the oscillator to the desired frequency prior to its switching in the second phase to put out the signal, in this way when the second phase is initiated the oscillator is already at the desired frequency so that the signal put out is immediately the one desired with no time being required in the second phase to pull-in the signal within the desired range.

DESCRIPTION OF THE DRAWINGS

The accompanying drawing having a single FIGURE is a schematic block-type circuit diagram generally illustrating a preferred embodiment of the circuit arrangement of the present invention.

DESCRIPTION OF THE PREFERRED EMBODIMENT

In the FIGURE, wherein for the purpose of illustration is shown a preferred embodiment of this invention, there is generally shown a high-frequency oscillation generator 0 having a first input for a control voltage *e*1 and a second input, independent of the first input, for applying a different second input voltage *e*2, this second input voltage being a modulation voltage. A phase comparison circuit P is provided for comparing the unmodulated high frequency output signal of the oscillation generator 0 with a signal from a reference frequency source N, which for example may be a highly stable crystal oscillator, after which the phase comparison circuit then generates a differential signal *d* which is a correction voltage signal dependent on the phase difference between the unmodulated output signal of the high frequency oscillation generator and the reference frequency source. The differential signal *d* is then fed to two electronic semi-conductor switching arrangements indicated generally by G and F.

The switching arrangement G, which will be discussed in greater structural detail hereinbelow, operates between a first position wherein it feeds the correction signal *d* as a control voltage to a storage capacitor as well as to the first input *e*1 of the high frequency oscillation generator, and in a second position wherein it cuts-off the phase comparison circuit P from the aforementioned storage capacitor and the aforementioned first input of the high frequency oscillation generator. In the first position of the switching arrangement G, the frequency of the high frequency oscillation generator is adapted to that of the reference frequency source.

A programmer PG controls the operation of four electrically operated switches S1, S2, S3, and S11 which, as controlled by the programmer, successively turn on and off the various phases of the various adjusting processes involving switching arrangements G and F, and the oscillation generator 0.

Referring now generally to the second switch S2, which will be referred to in greater detail hereinbelow, such switch is movable between a first position wherein it supplies a neutral voltage to the second input *e*2 of the high frequency oscillation generator 0, and to a second position wherein it supplies a modulation voltage M to the second input of the high frequency oscillation generator.

As will be discussed further hereinbelow, as long as the switch arrangement G and the switch S2 are in their second respective positions, the frequency generated by the high frequency oscillation generator 0 depends both on the potential of the end of the storage capacitor connected to the first input *e*1 of the oscillation generator 0, as well as on the modulation voltage M connected to the second input *e*2 of the oscillation generator 0. These two switches are controlled by the programmer PG which alternates between a first phase of operation and a second phase of operation, in the first phase bringing the switching arrangement G and the switch S2 into their first respective positions, and in its second phase of operation bringing the switch arrangement G and the switch S2 into their second respective positions.

The oscillation generator 0 is a Clapp type oscillator having a transistor TR31 along with resistors R31, R32, R33 and R34 and capacitor C. A first frequency-determining part of this oscillation generator is formed by coil L1, with a second frequency-determining part formed by series connected capacitors C34 and C35 arranged parallel to the coil. A capacitor C3 and a capacitance diode SK1 connected in series therewith act together to form a first voltage-dependent capacitance, and a capacitor C33 and a capacitance diode SK31 connected in series therewith act together to form a second voltage-dependent capacitance. Because of the voltage sensitivity (e.g. capacitance varies with voltage applied) of the capacitance diodes SK1 and SK31, the generated frequency of oscillation can be independently regulated by either applying potential over a resistor R6 connected in parallel with capacitance diode SK1, or alternatively, applying a potential over a resistor R36 connected in parallel with capacitance diode SK36. Corresponding control potentials *e*1 and *e*2 can be placed on the inputs to the oscillator 0. While the voltage *e*2 is applied directly to the capacitance diode SK31 over resistor R36, between the input for the voltage *e*1 and the voltage-dependent capacitance SK1 there is arranged, besides the resistance R6, a resistor R4, and also a field effect transistor TR3 connected in a source-follower type circuit. This transistor TR3 acts as a direct-current amplifier with a high resistance input effecting a considerable increase of the resistance of the regulating input with respect to that formed by the voltage-dependent capacitance SK1. Over the resistance R4 there arises a voltage proportional to the input voltage *e*1, such voltage nearly reaching the voltage input voltage *el*.

The switching arrangement G includes a field effect transistor TR1 which serves as a switch between the correction signal voltage d fed in over a resistance R1 connected in series between the phase comparison circuit P and the transistor TR1, and the regulating input of the oscillation generator 0. In the FIGURE, the switch S1 is shown in a position where the potential applied to the base of a transistor TR2 is supplied over a resistance R3 on negative potential so that transistor TR2 is in a blocked condition. Over a resistance R2, then, the control connection of the transistor TR1 is supplied with a positive potential of the correction signal voltage *d*, so that this transistor is in a conducting condition. If, in contrast, the switch S1 is moved to the position where it places ground on the base of transistor TR2, then transistor TR2 becomes conducting, the control connection of transistor TR1 then becomes negative, and transistor TR1 is thereby blocked.

The switching arrangement F includes a transistor TR11 which corresponds to the third switch mentioned earlier, a transistor TR12, resistances R11, R12, R13, and a switch S11, are operated and function in the same manner as the transistors and resistances previously described in connection with switching arrangement G. If the transistor TR11 is conducting, the control connection of a field effect transistor TR13 is then electrically connected with the correction signal voltage *d*, so that its potential *e*11 agrees with the correction potential. This transistor is switched in the same way as the previously described transistor TR3, and thereby a voltage proportional to the correction signal voltage d lies on a voltage divider consisting of two series connected resistances R14 and R15. The transistor TR13 and the voltage divider present the further switching circuit mentioned earlier, which, in a manner to be explained later, influence the frequency of the oscillation generator 0.

One end terminal of the first storage capacitor C2 is connected with the first input voltage e1 influencing the frequency of the oscillation generator 0, while its opposite end terminal is connected to the tap of the voltage divider between the resistances R14 and R15. A second storage capacitor C12 is provided in switching arrangement F and connected at one end to the connection between TR11, TR13, *e*11, C11, and at the other end to ground. If the two transistors TR1 and TR11 are conducting, then the second storage capacitor C12 is charged with the full value of the correction signal voltage *d*, and the first storage capacitor C2 is charged with but a part of the correction signal voltage *d*. This partial voltage on capacitor C2 corresponds approximately to the voltage on the resistance R14.

In the state in which the two switches S1 and S11 have shifted over and thereby the two transistors TR1 and TR11 are blocked, the connections between the transistors TR1 and TR3 as well as the connections between TR11 and TR13 separated by a high resistive value from further current conduction. Thereby, the charges of the two storage capacitors C2 and C12 can no longer change. Consequently, the potential *e*11 on the control connection of transistor TR13 remains unchanged, so that also the current flowing in the voltage divider R14, R15 does not change and the potential at its tap remains the same. Likewise, the first regulating voltage e1 remains unchanged.

The position represented in the FIGURE of the four switches S1, S2, S3, and S11 corresponds to the first phase as controlled by the programmer PG. In this phase, the correction signal voltage d then lies, on the one hand, on the regulating input of the oscillation generator 0 and on the first terminal connection of the first storage capacitor C2 and, on the other hand, on the control connection of the transistor TR13 and on the second storage capacitor C12. Thereby a voltage proportional to the correction signal voltage *d* and approximately reaching the value of the latter lies on the voltage divider consisting of the resistances R14 and R15. The switch S2 places on the modulation input *e*2 a neutral potential, and the open switch S3 prevents a delivery of the signal generated by the oscillation generator 0 to the output A.

Through the first input voltage voltage *e*1, the frequency of the oscillation generator 0 is influenced in the sense of its adaptation to the reference frequency source N, in which process at the end of the first phase of the programmer PG there is achieved a stable state and the two storage capacitors C2 and C12 have a certain charging state. After expiration of the first phase, an intermediate phase is initiated by the programmer PG by throwing over the switch S1 to ground and thereby blocking the transistor TR1, while the other switches S2, S3, and S11 remain in the positions shown in the FIGURE. Due to the capacitance present between the control connection of the transistor TR1 and its potential source in the initiation of the blocking of this transistor, that is, in the applying of blocking potential to the control connection of transistor TR1, there flows a current from ground over the resistance R15, over the storage capacitor C2, over the transistor TR1, over the collector and emitter of transistor TR2, to the negative pole of the voltage source. Through this pulse, the charge of the first storage capacitor C2 and thereby the potential on the input e1 is changed, the degree of this change depending on the ratio of the two capacitances lying in series. Due to this voltage jump the previous exact correspondence between the correction signal voltage d and the voltage *e*1, and thereby the agreement between the reference frequency source N and the frequency generated by the oscillation generator 0 is destroyed. The blocked state of the transistor TR1 prevents a change of the charge of capacitor C2, so that the potential e1 and thereby the frequency of the oscillation generator can no longer be influenced over this transistor.

Through the arrangement of the capacitance C1 being on the order of magnitude of the transistor capacitance mentioned, now the effect of the troublesome transistor capacitance is at least approximately compensated. In the throwing over of the switch S1 from the rest position shown in the FIGURE to the working position, the potential *e*3 occurring between the switch S1 and the resistance R3 alternates in the positive sense, i.e., in the sense opposite to the change at the control connection of transistor TR1. This positive voltage jump is now transmitted by means of the capacitor C1 to the first input *e*1 of the oscillation generator 0, in which process the polarity there arising is opposed to that of the voltage jump generated by the capacitance of the transistor TR1. Since the capacitance of the transistor TR1 is not a fixed value, but varies with voltage and temperature, the compensation is not completely successful. However, the accuracy of the compensation can be increased by precise adjustment of an adjustable capacitor used in place of capacitor C1, or by interposing between capacitor C1 and voltage *e*3 an adjustable voltage divider and precisely adjusting the same.

The voltage *e*1, and thereby the charge of the capacitor C2, are easily altered despite the compensating effect of the capacitor C1, which also has an effect on the frequency delivered by the oscillation generator 0. In consequence of the switch S11 that is still in the rest position in this intermediate phase, of the programmer PG, the voltage on the voltage divider consisting of the resistances R14 and R15 is still dependent on the correction signal voltage *d*. The slight detuning of the generated frequency occurring in the transition between the first phase and the intermediate phase also effects a change in the correction signal voltage d and thereby of the potential on the tap of the voltage dividers R14, R15. Since the capacitor C2 in consequence of the blocked transistor TR1 cannot change its charge, the changes of the voltage on the tap of the voltage divider are transferred in full scope as changes onto the voltage *e*1. This voltage is therefore further dependent on variations of the correction signal voltage *d*, so that renewed adjustment of the frequency generated by the oscillation generator 0 to reach the desired frequency can be made, in which, however, in consequence of the action of the voltage divider, the steepness of the influence on the frequency by the correction signal voltage is smaller than during the first phase. Near the end of the intermediate phase, the frequency generated by the oscillation generator 0 has again been adapted to the desired frequency, the charge of the capacitor C2 corresponds to a coarse correction of the generated frequency, and the difference of the charges of the capacitors C2 and C12 correspond to a fine correction of the generated frequency.

After termination of the intermediate phase by the programmer PG, the switches S2, S3 and S11 are switched over and thereby the second phase of the programmer is initiated. The control input of the transistor TR13 is separated from the correction signal voltage d so that its potential and thereby the potential at the tap of the voltage divider R14, R15 is determined only by the charge of the capacitor C12. The voltage jump generated through the effect of the capacitance of the transistor TR11 is in part compensated by the capacitor C11, in correspondence to the effects of capacitor C1 in respect to transistor TR1. Due to the effect of the voltage divider R14, R15, however, the influence of the remaining voltage jump on the generated frequency is smaller in a measure determined by the ratio of the voltage divider R14, R15 and thereby by the ratio of the regulating steepnesses than in the voltage jump evoked by the capacitance of the transistor TR1. In this manner remaining frequency error can be kept very small.

The switching of switches S2 and S3 by the programmer PG in the transition from the intermediate phase to the second phase, now brings about the applying of a modulating voltage M to the voltage-dependent capacitance SK31, and the generated oscillation is supplied through switch S3 to the output A. The frequency given during the second phase to the output A is governed, on the one hand, according to the first input voltage *e*1 applied by the capacitor C2 and, on the other hand, according to the second input voltage *e*2 applied during this second phase at the value of modulation input M. Therefore, this presents a high frequency output signal A modulated in its frequency by the signal supplied to the modulation input M, of which the fundamental frequency is very precise.

The advantage of the interposing of an intermediate phase between the first phase and the second phase lies in that, on the one hand, through the great steepness in the first phase any oscillation generator that has deviated in the unregulated state rather severely from the desired frequency is restored to the desired frequency with a relatively small correction voltage so that the pull-in range (i.e. amount oscillator must be adjusted to return to desired frequency) is great, while in the intermediate phase the steepness and pull-in range are small, but the effects of the disturbances occurring in the switching off of the regulating voltage are reduced. Since the intermediate phase follows upon the first phase, during this phase a large pull-in range is not necessary. Since the regulation is phase controlled, the smaller steepness has no influence on the accuracy of the frequency regulation.

It is, of course, also possible to carry out the regulation in more than two phases, whereby the precision can be increased almost arbitrarily high.

It is understood that the form of this invention herewith shown and described is to be taken as a preferred example of the same, and that various changes in arrangement of parts may be resorted to without departing from the spirit of the invention or the scope of the subjoined claims.

What is claimed is:

1. An electrical circuit for generating a high frequency oscillation of high frequency precision intermittently modulatable in its frequency, comprising:

a high frequency oscillation generator having a first input for a control voltage and a second input independent of the first input for a modulation voltage;

reference frequency source;

a phase comparison circuit for generating a correction signal dependent on the phase difference between the unmodulated high frequency oscillation and the reference frequency oscillation;

a first storage capacitor having one end connected to the first input of the high frequency oscillation generator;

a first electronic switch having a first and second position, in its first position feeding the correction signal as control voltage to the storage capacitor and to the first input of the high frequency oscillation generator for adapting its frequency to that of the reference frequency source, and in its second position separating the phase comparison circuit from the storage capacitor and the first input of the high frequency oscillation generator;

a second electronic switch having a first and second position, in its first position feeding a neutral voltage to the second input of the high frequency oscillation generator, and in its second position feeding a modulation voltage to the second input of the high frequency oscillation generator whereby when the first and second electronic switches are each in their respective second positions the frequency generated by the high frequency oscillation generator is dependent both on the potential of the terminal of the end of the storage capacitor connected with the first input and also on the modulation voltage;

a programmer which in a first phase of operation brings each of the first and second electronic switches into their respective first positions, and in a second phase of operation brings each of the first and second switches into their respective second positions, the programmer adapted to alternate between its two phases of operation;

a third electronic switch controlled by the programmer;

control means controlled by the third switch for controlling the frequency of the high frequency oscillation generator as a function of the correction signal;

a second storage capacitor connected in parallel with the control means so that the influence of the correction signal on the control means as to the frequency of the high frequency oscillation generator is smaller than the influence of the correction signal if applied directly to the first electronic switch, the programmer having an intermediate phase interposed between the first and second phases during which intermediate phase the correction signal acts only over the control means, and that during the second phase the control means are separated from the phase comparison circuit leaving the second storage capacitor connected to the first input.

2. An electrical circuit arrangement according to claim 1 wherein the control means include a direct-current amplifier having a high-resistive input, and a voltage divider connected in series with the output of the current amplifier, the other end of the first storage capacitor being connected to the tap of the voltage divider, the direct-current amplifier applying voltage at least approximately proportional to its input voltage to the voltage divider so that during the intermediate phase of operation of the programmer the changes of the correction signal voltage on the tap of the voltage divider influence the voltage on the first input of the high frequency oscillation generator and thereby the frequency generated by it, and the first storage capacitor being constantly charged only to the degree determined by the amplification of the direct-current amplifier and the ratio of the voltage divider.

* * * * *